United States Patent [19]

Kida et al.

[11] Patent Number: 4,690,811

[45] Date of Patent: Sep. 1, 1987

[54] PROCESS FOR PREPARING SILICON CARBIDE WHISKERS

[75] Inventors: Tohru Kida, Chigasaki; Motohiro Yamamoto, Fujisawa, both of Japan

[73] Assignee: Tokai Carbon Co., Ltd., Tokyo, Japan

[21] Appl. No.: 798,787

[22] Filed: Nov. 18, 1985

[30] Foreign Application Priority Data

Nov. 21, 1984 [JP] Japan ................. 59-244554

[51] Int. Cl.$^4$ ............................. C01B 31/36
[52] U.S. Cl. ..................................... 423/345
[58] Field of Search ......................... 423/345

[56] References Cited

U.S. PATENT DOCUMENTS 4,500,504  2/1985  Yamamoto ................. 423/345

FOREIGN PATENT DOCUMENTS 0213700  12/1984  Japan .................. 423/345

Primary Examiner—John Doll
Assistant Examiner—Lori S. Freeman
Attorney, Agent, or Firm—Armstrong, Nikaido, Marmelstein & Kubovcik

[57] ABSTRACT

The present invention provides a process for preparing silicon carbide whiskers. According to the process, carbon black having the following properties (a) to (c) is blended, as a carbonaceous material, with a silicon source material, and the resulting mixture is heated in a non-oxidizing atmosphere at 1,300° to 1,800° C.

(a) Nitrogen adsorption specific surface area: 150 to 500 m$^2$/g
(b) Dibutyl phthalate absorption: 120 to 200 ml/100 g.
(c) Tint strength (%): equal to or below a value calculated according to the following formula:

$0.3496 \times$ (nitrogen adsorption specific surface area) $- 0.2143 \times$ (dibutyl phthalate absorption) $+ 101.87$

6 Claims, No Drawings

PROCESS FOR PREPARING SILICON CARBIDE WHISKERS

BACKGROUND

The present invention relates to a process for preparing fine fibrous whiskers of single crystals of silicon carbide (hereinafter referred to as SiC), and more specifically to a process for preparing SiC whiskers having a high homogeneity and excellent characteristics in shapes thereof.

SiC whiskers are superior in properties such as specific strength, specific elastic modulus, heat resistance, and chemical stability. Thus, they have recently been recognized as a useful reinforcing material of composites with metal, plastic, ceramic, or the like.

Preparation of SiC whiskers involves various factors such as silicon source material, kinds of carbonaceous material and third component, blending ratio, blending method, reaction atmosphere, reaction temperature, catalyst and so forth. Therefore, the quality and yield of the formed whiskers greatly depend on these factors. Accordingly, how to combine these factors has a decisive significance in obtaining SiC whiskers in a high yield. Thus there have heretofore been proposed many preparation processes with variations of the above-mentioned factors.

However, in such conventional processes for preparing SiC whiskers, investigations were made mainly on the silicon source material and the third component such as catalyst or whisker formation promotor, while no detailed investigations were made on the influence of the properties of the carbonaceous material on whiskers formed. In view of this, the inventors of the present invention have made various investigations focused, among various carbonaceous materials, on carbon black, of which the particle characteristics can be relatively easily controlled or adjusted. As a result, they have found that use of carbon black within given selective characteristic ranges as the carbonaceous material markedly improves the quality, yield, etc. of SiC whiskers formed, and proposed a process in Japanese Patent Application No. 85,906/1983 (Japanese Patent Laid-Open No. 213,700/1984).

According to the proposed process, when use as the carbonaceous material is made of carbon black having a nitrogen adsorption specific surface area of at least 40 $m^2/g$, a dibutyl phthalate absorption of at least 90 ml/100 g, and a tint strength smaller than or equal to a value calculated according to a formula: $[0.3496 \times (BET$ specific surface area$) - 0.2143 \times ($dibutyl phthalate absorption$) + 101.87]$, high-quality SiC whiskers substantially free from particulate SiC can be prepared in high yields. In order that SiC whiskers exhibit a superior performance as the reinforcing material of a composite with a metal or a plastic, however, it is necessary that the whiskers have the following characteristics in their shapes.

(a) There are few crooked or branched whiskers. The crystals are grown straight and long.

(b) The whiskers are excellent in uniformity of diameter and length, and homogeneity of aspect ratio.

In view of the above, the inventors of the present invention have made further detailed investigations on a relationship between the particle characteristics of the carbon black and the shapes of whiskers formed. As a result, they have found that, when carbon black having a nitrogen adsorption specific surface area, a dibutyl phthalate absorption, and a tint strength within respectively specified ranges is used, long whiskers can be obtained which have not only an increased aspect ratio (a length to diameter ratio of whisker) but also an improved homogeneity thereof, and which are grown straight with little deformation such as crooking or branching, and completed the present invention based on these findings.

SUMMARY

The first object of the present invention is to provide a process for preparing high quality SiC whiskers.

The second object of this invention is to provide a process for preparing SiC whiskers having not only a high aspect ratio but also an excellent homogeneity thereof.

The third object of this invention is to provide a process for preparing long SiC whiskers of straightly grown crystals with few crooked or branched shapes.

THE PREFERRED EMBODIMENTS

In the present invention, carbon black having the following characteristics (a) to (c) is employed as the carbonaceous material.

(a) Nitrogen adsorption specific surface area
150–500 $m^2/g$ (b) Dibutyl phthalate absorption
120–200 ml/100 g (c) Tint strength (%)
equal to or below a value calculated according to a formula: $[0.3496 \times ($nitrogen adsorption specific surface area$) - 0.2143 \times ($dibutyl phthalate absorption$) + 101.87]$ These properties (a) to (c), of which the methods of measurement will be described later, are indices usually employed for evaluation of the particle characteristics of carbon black.

Here, the value of (a) is a parameter demonstrating the particle size of carbon black, too. The larger the value of (a) is, the smaller the particle size becomes.

When (a) is less than 150 $m^2/g$, a difficulty is encountered in uniform and rapid progress of a whisker formation reaction because the specific surface area involved in the SiC whisker formation reaction is relatively small. On the other hand, when the specific surface area is as large as more than 500 $m^2/g$ in (a), no substantial improvement is observed in uniformity of the whisker formation reaction.

The value of (b) is a yardstick suggesting the structure (chain state aggregate structure) of carbon black. The larger the value of (b) is, the larger the growth of the structure becomes.

When (b) is less than 120 ml/100 g, the growth of the chain state aggregate structure of carbon black particles is so small that no sufficient spaces can be formed which allow the SiC whisker formation reaction in the surfaces of the carbon black particles to smoothly progress. Therefore, the whisker formation reaction is prohibited, leading to a lowered yield and a difficulty in obtaining whiskers of crystals which has grown straight and long. On the other hand, even use of carbon black having a structure with a value of (b) exceeding 200 ml/100 g cannot provide any marked effect thereof on improvement in not only the characteristics of formed whiskers in the shapes thereof but also the yield, which are, therefore, limited.

The value of (c) is essentially an index demonstrating the degree of blackness of carbon black but simultaneously an index generically representing the morphological structure of the carbon black particles including a particle size and a distribution thereof, a size of structure and a distribution thereof, etc.

A value of (c) below the value calculated according to the above-mentioned formula suggests that the carbon black has a relatively low tint strength as against the levels of nitrogen adsorption specific surface area and dibutyl phthalate absorption, and means that the particle size distribution and the structure distribution are relatively wide.

As is apparent from the foregoing, the carbon black to be used in this invention, which satisfies the requisites (a) to (c), is characterized by a large specific surface area, a well grown structure, and adequately large distribution widths of them.

Examples of the carbon black include furnace black easily prepared by adequately controlling various conditions such as the kind of hydrocarbon used as the raw material in the preparation, the mixing ratio of the hydrocarbon and air, the temperature in the pyrolytic reaction, and the gas residence time in the reaction zone, carbon black as a by-product in the preparation of a synthesis gas comprising hydrogen and carbon monoxide by partial oxidation of hydrocarbon in the presence of steam; and conductive carbon black obtained by heat-treating carbon black as a by-product in the preparation of synthesis gas to effect modification.

Silica sand, silica stone, rice hull ash, and silica gel can be used as the silicon source material, which is subjected together with the carbon black to the reaction.

The blending proportion of the carbon black to 100 parts by weight of silicon source material is set within a range of 110 to 400 parts by weight, preferably 110 to 200 parts by weight from the viewpoints of SiC whisker yield, incineration of the residual carbon, etc. When the proportion of the carbon black is lower than 110 parts by weight there appear portions crowded with $SiO_2$, where $SiO_2$ is liable to remain unreacted. On the other hand, when the proportion exceeds 400 parts by weight, the amount of SiC whiskers formed per unit volume is small with an increased amount of the carbon black remaining unreacted.

In the present invention, a third component such as a catalyst or an assistant is preferably added to the silicon source material and the carbon black as the carbonaceous material. The catalysts which can be used include at least one compound selected from the group consisting of compounds of iron, nickel and cobalt, such as $FeCl_2.4H_2O$, $Ni(NO_3)_2.6H_2O$, and $CoCl_2.6H_2O$. The assistants include sodium chloride (NaCl) capable of functioning as a material for forming spaces.

The amount of the catalyst that may be added is 0.5 to 5 wt. % based on $SiO_2$ as the silicon source material. The amount of NaCl that may be added is 1 to 100 wt. % based on $SiO_2$ as the silicon source material. The growth of SiC whiskers is more effectively promoted by the catalyst and the material for forming spaces.

In the preparation of SiC whiskers according to the present invention, the carbon black as the carbonaceous material, the silicon source material, and preferably the third component are filled in, for example, a graphite reactor.

A graphite lid is attached to the reactor, which is then held in an electric furnace kept in a non-oxidizing atmosphere at 1,300° to 1,800° C., preferably 1,500° to 1,700° C. for at least 20 minutes to effect formation of SiC whiskers.

The carbon black as the carbonaceous material remaining unreacted in the product is removed by incineration in air at a temperature of at least 550° C. or a separation treatment with a solvent. Thus SiC whiskers assuming a lightly greenish white color are obtained. A hydrophobic liquid such as kerosene having a strong affinity for carbon blacks is used as the solvent.

SiC whiskers are formed through a reaction between the silicon component and the carbon component in the course of heating the raw material substances to convert them into fine fibrous single crystals of SiC. In this reaction, use of carbon black having a nitrogen adsorption specific surface area, a dibutyl phthalate absorption, and a tint strength within respective ranges as specified in the present invention can allow the formation and growth of whisker crystals on the surfaces of the carbon black to progress very uniformly and homogeneously. As a result, long fibrous SiC whiskers of high quality composed of crystals grown straight with few crooks and branches can be obtained.

Measurement methods adopted in this invention will now be described. (1) Nitrogen Adsorption Specific Surface Area:

The measurement is made in accordance with ASTM D3037-78 "Standard Methods of Testing Carbon Black - Surface Area by Nitrogen Adsorption" Method B.

(2) Dibutyl Phthalate Absorption:

The measurement is made in accordance with JIS K6221 (1975) "Testing Methods of Carbon Blacks for Rubber Industry", 6.1.2 Oil Absorption Method A (corresponding to ASTM D2414-82).

Specifically, a predetermined amount of dried carbon black is placed in a mixing chamber of an absorptometer, in which a limit switch operates to automatically stop the dropping of dibutyl phthalate from a burette when the torque of a rotor provided in the mixing chamber turns to have a given value. The oil absorption is calculated from the reading (V) of the burette according to the following formula:

$$OA = \frac{V}{W_o} \times 100$$

wherein OA is the oil absorption (ml/100 g) and $W_o$ is the weight (g) of dried carbon black. (3) Tint Strength The measurement is made in accordance with ASTM D3265-80 "Standard method of testing carbon black - Tint Strength".

EXAMPLES

A silicon dioxide powder ($SiO_2$ content: 99.5%, all particles passing through a 150 mesh sieve.) having 3.7 wt. % of $CoCl_2.6H_2O$ preliminarily added as the catalyst was used as the silicon source material. The powder was uniformly mixed with 120 parts by weight in blending ratio, of each of carbon blacks having mutually different properties with respect to nitrogen adsorption specific surface area, dibutyl phthalate absorption, and tint strength. 100 wt. %, based on the silicon source material, of NaCl as the material for forming spaces was admixed with each mixture obtained to provide a system of mixed raw materials. 50.0 g of the mixed raw materials in each system were softly filled in a high-purity graphite reactor having an internal diameter of 70 mm and a height of 150 mm. Therefore, a graphite lid was attached to the reactor, which was then moved into an Acheson type electric furnace. The reactor was packed therearound with a coke grain packing. Subsequently, the temperature of the furnace was elevated by passing an electric current through the furnace, and maintained at 1,550° C. for one hour while keeping the inside of the furnace in a state of a non-oxidizing atmosphere. Thus the whisker formation reaction was completed. Each reaction product was withdrawn from the reactor, and subjected to a heat treatment in air at a temperature of 700° C. to completely burn remaining unreacted carbon black for removal thereof. Every product was β-SiC whiskers having a lightly greenish white an alga-like appearance. However, differences in properties and uniformity of whiskers obtained between the products were recognized depending on the properties of the carbon blacks used as the carbonaceous materials.

These results are shown in the below recited Table.

Thus, according to the process of this invention, high-quality SiC whiskers can be obtained.

What is claimed is:

1. A process for preparing silicon carbide whiskers, comprising blending a silicon source material with carbon black, as a carbonaceous material, having (a) a nitrogen adsorption specific surface area of 150 to 500 $m^2/g$, (b) a dibutyl phthalate absorption of 120 to 200 ml/100 g, and a tint strength (%) smaller than or equal to a value calculated according to the following formula: 0.3496×(nitrogen adsorption specific surface area)−0.2143×(dibutyl phthalate absorption)+101.87; and heating the resulting mixture in a non-oxidizing atmosphere at 1,300° to 1,800° C.

2. A process for preparing silicon carbide whiskers as claimed in claim 1, wherein the blending proportion of said carbon black to 100 parts by weight of said silicon source material is 110 to 400 parts by weight.

3. A process for preparing silicon carbide whiskers as claimed in claim 1, wherein at least one compound of a metal selected from the group consisting of iron, nickel, and cobalt is added as a catalyst to said mixture.

4. A process for preparing silicon carbide whiskers as claimed in claim 1, wherein sodium chloride is added as a material for forming spaces to said mixture.

5. A process for preparing silicon carbide whiskers as claimed in claim 1, wherein said carbon black is furnace black, carbon black as a by-product in the preparation of synthesis gas, or conductive carbon black prepared by heat-treating carbon black as a by-product in the preparation of synthesis gas to effect modification.

6. A process for preparing silicon carbide whiskers as claimed in claim 1, wherein said silicon source material is silica sand, silica stone, rice hull ash, or silica gel.

TABLE

| Examples | Run No. | Carbon black as carbonaceous material ||||  Properties of formed SiC whiskers |||||
|---|---|---|---|---|---|---|---|---|---|---|
| | | Nitrogen adsorption specific surface area ($m^2/g$) | Dibutyl phthalate absorption (ml/100 g) | Tint strength (%) | Calculated value of tint strength | | Characteristics in shape ||| |
| | | | | | | Aspect ratio | Crook | Branch | Number* of shots | Overall evaluation |
| Invention | 1 | 170 | 160 | 119 | 127 | 150–250 | few | few | 3 | good |
| | 2 | 206 | 158 | 96 | 140 | 250–400 | " | " | 3 | excellent |
| | 3 | 220 | 144 | 146 | 148 | 300–450 | " | " | 3 | " |
| | 4 | 226 | 146 | 119 | 150 | 350–450 | " | " | 2 | " |
| | 5 | 356 | 165 | 124 | 191 | 400–550 | " | " | 3 | " |
| | 6 | 488 | 174 | 102 | 183 | 300–500 | " | " | 2 | " |
| Comparative | 7 | 59 | 187 | 68 | 82 | 20–160 | quite many | many | 30 | bad |
| | 8 | 88 | 138 | 88 | 103 | 40–170 | quite many | " | 28 | " |
| | 9 | 97 | 128 | 106 | 108 | 60–200 | many | " | 11 | " |
| | 10 | 171 | 129 | 141 | 137 | 80–250 | few | " | 8 | " |
| | 11 | 300 | 102 | 151 | 185 | 100–300 | many | few | 13 | " |

Note:
*Number of irregularly shaped SiC whiskers observed in the field of vision (235μ × 160μ) through a 500-magnification microscope.

As is apparent from the table, SiC whiskers formed in Examples of this invention (Runs Nos. 1 to 6) wherein carbon blacks having a nitrogen adsorption specific surface area, a dibutyl phthalate absorption, and a tint strength (%) as specified in the present invention were used as the carbonaceous material have a high aspect ratio and a high homogeneity thereof as compared with those formed in Comparative Examples (Runs Nos. 7 to 11). Furthermore, the products prepared according to the present invention include few irregularly shaped whiskers such as crooked or branched ones and have an excellent shape.